(12) United States Patent
Lee et al.

(10) Patent No.: US 9,812,331 B2
(45) Date of Patent: Nov. 7, 2017

(54) APPARATUS FOR AND METHOD OF PROCESSING SUBSTRATE

(71) Applicant: SAMSUNG ELECTRONICS CO., LTD., Suwon-si, Gyeonggi-do (KR)

(72) Inventors: Uihyoung Lee, Hwaseong-si (KR); Donghyun Lee, Gumi-si (KR); Jinhyoung Kim, Yongin-si (KR); Jaihyung Won, Seoul (KR); Sanghyun Lee, Suwon-si (KR); Jinho Choi, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 78 days.

(21) Appl. No.: 14/709,775

(22) Filed: May 12, 2015

(65) Prior Publication Data

US 2015/0325490 A1   Nov. 12, 2015

(30) Foreign Application Priority Data

May 12, 2014   (KR) .................. 10-2014-0056645

(51) Int. Cl.
*C25D 21/14* (2006.01)
*G05D 11/08* (2006.01)
*H01L 21/288* (2006.01)
*H01L 21/306* (2006.01)
*H01L 21/66* (2006.01)
(Continued)

(52) U.S. Cl.
CPC .......... *H01L 21/306* (2013.01); *C25D 17/001* (2013.01); *C25D 21/14* (2013.01); *H01L 21/2885* (2013.01); *H01L 21/30604* (2013.01); *H01L 21/67086* (2013.01);
(Continued)

(58) Field of Classification Search
CPC ........ C25D 21/12; C25D 21/14; C25D 21/18; C25D 17/001; C23C 18/1617
See application file for complete search history.

(56) References Cited

U.S. PATENT DOCUMENTS 3,734,840 A    5/1973 Passal
6,808,611 B2   10/2004 Sun et al.
(Continued)

FOREIGN PATENT DOCUMENTS

KR   10-1994-0007441 A    8/1994
KR   10-1999-0016616 A    3/1999
KR      10-0824802 B1     4/2008

*Primary Examiner* — Raj R Gupta
(74) *Attorney, Agent, or Firm* — Lee & Morse, P.C.

(57) ABSTRACT

Provided are an apparatus for and a method of processing a substrate. The substrate processing apparatus includes a substrate processing unit to process a substrate using a processing solution containing a mixture of first and second sources; a source supplying part to supply the first and second sources to the substrate processing unit; at least one analyzer to measure a concentration of the second source in the processing solution or a pH value of the processing solution and adjust a measurement reference value of the second source in the processing solution using a standard solution, in which the first and second sources are mixed to have a predetermined concentration or pH value; and a standard solution supplying part to prepare the standard solution using the first and second sources to be supplied from the source supplying part and to supply the standard solution to the at least one analyzer.

14 Claims, 13 Drawing Sheets

(51) Int. Cl.
  *H01L 21/67* (2006.01)
  *C25D 17/00* (2006.01)
  *H01L 21/768* (2006.01)

(52) U.S. Cl.
  CPC ........ *H01L 21/67253* (2013.01); *H01L 22/26* (2013.01); *H01L 21/76898* (2013.01)

(56) References Cited

U.S. PATENT DOCUMENTS

| | | |
|---|---|---|
| 6,958,113 B2 | 10/2005 | Mizohata et al. |
| 6,998,095 B2 | 2/2006 | Anderson et al. |
| 7,172,683 B2 | 2/2007 | Isayama et al. |
| 7,205,153 B2 | 4/2007 | Balisky |
| 7,717,060 B2 | 5/2010 | Hues et al. |
| 2003/0183513 A1 | 10/2003 | Shinmura |
| 2004/0016644 A1* | 1/2004 | Isayama ................ C25D 21/12 205/82 |
| 2004/0203165 A1* | 10/2004 | Balisky ................ G01N 31/16 436/106 |
| 2006/0128028 A1 | 6/2006 | Anderson et al. |
| 2007/0102285 A1 | 5/2007 | Isayama et al. |
| 2009/0157229 A1* | 6/2009 | Rulkens ................ C25D 21/12 700/267 |
| 2009/0222219 A1* | 9/2009 | Some ................ G01N 15/0205 702/25 |

\* cited by examiner

APPARATUS FOR AND METHOD OF PROCESSING SUBSTRATE

CROSS-REFERENCE TO RELATED APPLICATION

Korean Patent Application No. 10-2014-0056645, filed on May 12, 2014, in the Korean Intellectual Property Office, and entitled: "Apparatus for and Method of Processing Substrate," is incorporated by reference herein in its entirety.

BACKGROUND

1. Field

Example embodiments relate to an apparatus for and a method of processing a substrate, for example, to an apparatus for performing electroplating and etching processes on a substrate and a method of processing a substrate using the same.

2. Description of the Related Art

As the electronic industry matures, there may be an increasing demand for high-performance, high-speed and compact electronic components. To meet such requirements, a semiconductor packaging technology of stacking a plurality of semiconductor chips on one substrate may be used. For example, the use of a through-silicon via may allow for a reduction in interconnection length between a substrate and a semiconductor chip and between stacked semiconductor chips. The through-silicon via may be made of a copper layer formed by an electroplating process.

SUMMARY

Embodiments may be realized by providing a substrate processing apparatus, including a substrate processing unit to process a substrate using a processing solution containing a mixture of first and second sources; a source supplying part to supply the first and second sources to the substrate processing unit; at least one analyzer to measure a concentration of the second source in the processing solution or a pH value of the processing solution and adjust a measurement reference value of the second source in the processing solution using a standard solution, in which the first and second sources are mixed to have a predetermined concentration or pH value; and a standard solution supplying part to prepare the standard solution using the first and second sources to be supplied from the source supplying part and to supply the standard solution to the at least one analyzer.

The standard solution supplying part may include a standard solution bath containing the standard solution; and a plurality of standard solution supplying lines connecting the standard solution bath to the source supplying part.

The standard solution supplying part may further include standard mass flow controllers on the standard solution supplying lines respectively to control flow rates of the first and second sources to be supplied to the standard solution bath.

The source supplying part may include a first source supplying part to supply the first source to each of the substrate processing unit and the standard solution supplying part; and a second source supplying part to supply the second source to each of the substrate processing unit and the standard solution supplying part. The standard solution supplying lines may include standard source supplying lines connected to the first and second source supplying parts, respectively; and a standard source mixing line connecting the standard source supplying lines to the standard solution bath and mixing the first and second sources with each other.

The standard source supplying lines may include a first standard source line connecting the first source supplying part to the standard source mixing line; and a second standard source line connecting the second source supplying part to the standard source mixing line.

The standard mass flow controllers may include a first standard mass flow controller on the first standard source line to control the flow rate of the first source; and a second standard mass flow controller on the second standard source line to control the flow rate of the second source. The first and second sources in the standard solution may have a predetermined mixing ratio in the standard solution bath.

The first source supplying part may include a first source tank containing the first source; a first source supplying line connecting the first source tank and the substrate processing unit; and a first source process mass flow controller on the first source supplying line to control the flow rate of the first source. The first source tank may be connected to the first standard source line.

The second source supplying part may include a second source tank containing the second source; a second source line connecting the second source tank and the substrate processing unit; and a second source process mass flow controller on the second source line to control the flow rate of the second source. The second source tank may be connected to the second standard source line.

The standard solution supplying lines may include standard solution dispensing lines between the standard solution bath and the at least one analyzer.

The at least one analyzer may include an optical analyzer optically measuring a concentration of the second source in the standard solution; and an electrical analyzer electrically measuring the concentration of the second source in the standard solution. The standard solution dispensing lines may connect the standard solution bath to the optical and electrical analyzers, respectively.

The apparatus may further include a processing solution collecting line connecting the substrate processing unit to the optical and electrical analyzers to supply the processing solution in the substrate processing unit to the optical and electrical analyzers.

The optical analyzer may include a degasser to remove an air bubble from the processing solution or the standard solution; a column extending from the degasser and through which at least one of the processing solution and the standard solution flows; and a photodetector sensing the second source in the at least one of the processing solution and the standard solution flowing through the column. The degasser may be connected to the standard solution dispensing lines and the processing solution collecting line.

The electrical analyzer may include a chemical solution bath containing the processing or standard solution; electrodes dipped in the processing or standard solution of the chemical solution bath; and an ammeter measuring an electric current flowing between the electrodes. The chemical solution bath may be connected to the processing solution collecting line and the standard solution dispensing lines.

Embodiments may be realized by providing a method of processing a substrate, including treating a substrate using a processing solution, in which first and second sources supplied from first and second source supplying parts, respectively, are mixed with each other; determining whether to measure a concentration of the second source in the processing solution or a pH value of the processing solution;

adjusting a measurement reference value of an analyzer, the adjusting including preparing a standard solution containing the first and second sources, which are supplied from the first and second source supplying parts, respectively, and measuring a concentration of the second source in the standard solution or a pH value of the standard solution; measuring a concentration of the second source in the processing solution or a pH value of the processing solution, using the measurement reference value; and controlling a flow rate of the second sources supplied in the processing solution, based on the concentration of the second source or the pH value of the processing solution.

Adjusting the measurement reference value may include supplying the first and second sources from the first and second source supplying parts to a standard solution supplying part to have a predetermined mixing ratio; mixing the first and second sources to prepare the standard solution; supplying the standard solution to the analyzer; and measuring the concentration of the second source in the standard solution to adjust the measurement reference value of the analyzer.

Embodiments may be realized by providing a method of adjusting an analyzer of a processing apparatus in real time, including preparing a standard solution in the processing apparatus, the standard solution having a known characteristic value; supplying the standard solution to the analyzer; measuring a characteristic of the standard solution to provide a measured characteristic value; and adjusting a measurement reference value of the analyzer based on a difference between the measured characteristic value and the known characteristic value.

Measuring a characteristic of the standard solution may include measuring a concentration of one or more additives in the standard solution.

Measuring the concentration of one or more additives in the standard solution may include an optical method.

Measuring the concentration of one or more additives in the standard solution may include an electrical method.

The method may further include removing the standard solution from the analyzer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
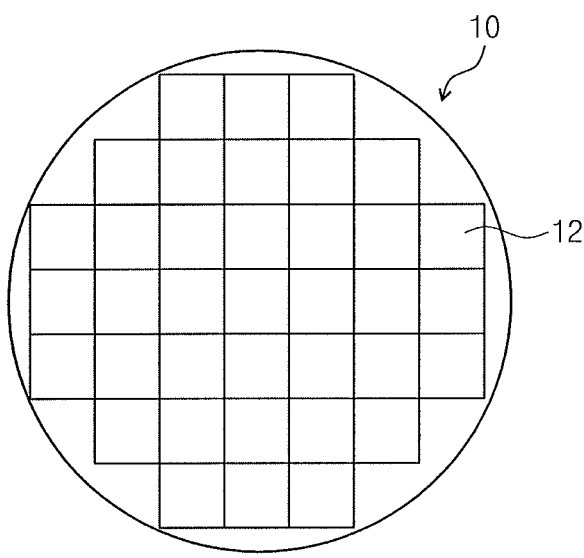
FIG. 1 illustrates a plan view of an example of a substrate according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "under" versus "directly under," "between" versus "directly between," "adjacent" versus "directly adjacent," "on" versus "directly on").

It will be understood that, although the terms "first", "second", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of skill in the art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Some examples of a substrate to be processed will be described with reference to FIGS. 1 through 3.

FIG. 1 illustrates a plan view of an example of a substrate 10 according to example embodiments. As shown in FIG. 1, the substrate 10 may be provided in the form of a semiconductor wafer having a circular shape. In example embodiments, the substrate 10 may include a plurality of chip dies 12, each of which has a rectangular shape. Each of the chip dies 12 may be used as a semiconductor device (e.g., 18 of FIG. 3). For example, the semiconductor devices 18 may be formed or integrated on the chip dies 12, respectively. After the formation of the semiconductor device 18, the chip dies 12 of the substrate 10 may be divided into a plurality of semiconductor chips. Productivity in a process of fabricating semiconductor chips may be proportional to the number of the chip dies 12 provided on the substrate 10.

Figure 2:
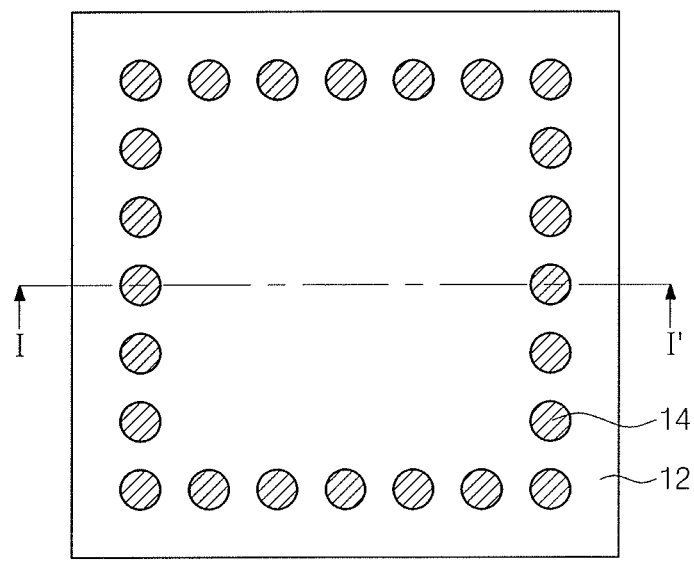
FIG. 2 illustrates a plan view of the chip die of FIG. 1.

FIG. 2 illustrates a plan view of the chip die 12 of FIG. 1. Referring to FIG. 2, the chip die 12 may include through-silicon vias 14. In example embodiments, the through-silicon vias 14 may be arranged along an edge of the chip die 12. The semiconductor device may be provided at a center region of each chip die 12. In an embodiment, the through-silicon vias 14 may be arranged near the center region of the chip die 12.

Figure 3:
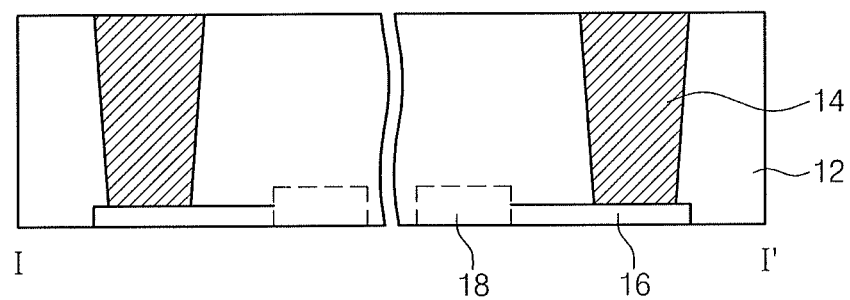
FIG. 3 illustrates a sectional view taken along line I-I' of FIG. 2.

FIG. 3 illustrates a sectional view taken along line I-I' of FIG. 2. Referring to FIG. 3, pads 16 may be provided below the through-silicon vias 14, respectively. The pads 16 may connect the through-silicon vias 14 electrically with the semiconductor devices 18. The semiconductor devices 18 may be provided in a lower or bottom portion of the chip die 12. The semiconductor devices 18 may include a transistor, a diode, a resistor, or a capacitor. In other example embodiments, the pads 16 may be provided on the through-silicon vias 14, respectively. The semiconductor devices 18 may be provided in an upper or top portion of the chip die 12.

The through-silicon vias 14 may be provided to penetrate the chip die 12. The through-silicon vias 14 may be formed of or include, for example, a copper layer. The through-silicon vias 14 may be formed in a substrate processing apparatus. For example, in example embodiments, the substrate processing apparatus may be or include an electroplating apparatus.

Although not shown, the chip dies 12 may be mounted on a printed circuit board (not shown). The chip dies 12 may be sequentially stacked on the printed circuit board to form a stacked structure. The chip dies 12 may be electrically connected to each other. The pads 16 and the through-silicon vias 14 may be configured to reduce or minimize an electrical interconnection length between the chip dies 12.

Hereinafter, examples of the substrate processing apparatus will be described with reference to FIGS. 4 through 7.

[Substrate Processing Apparatus: Example Embodiments]

Figure 4:
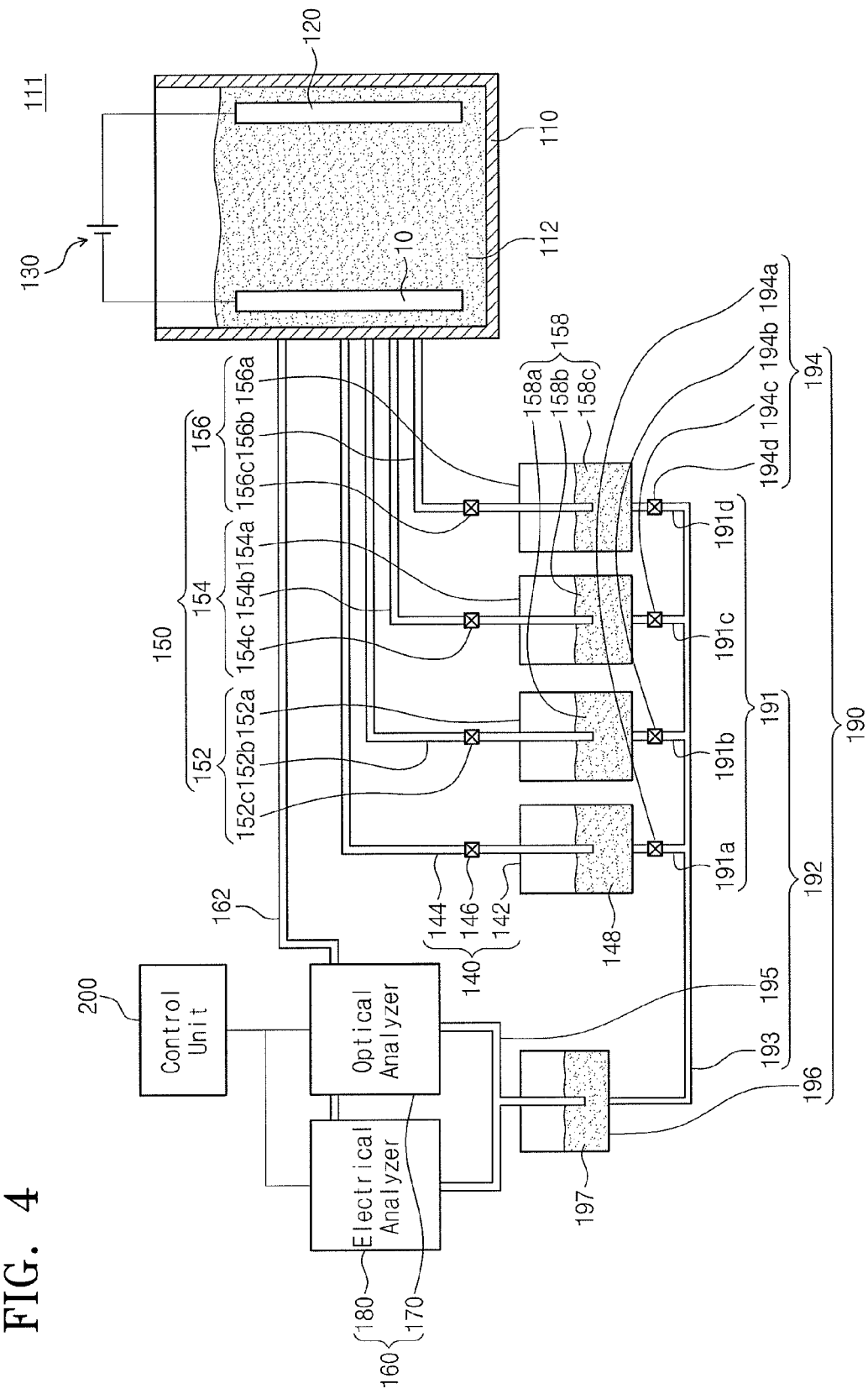
FIG. 4 illustrates a diagram of an apparatus for processing a substrate according to example embodiments.

FIG. 4 illustrates a diagram of an apparatus 111 for processing a substrate (hereinafter, a substrate processing apparatus) according to example embodiments. The substrate processing apparatus 111 may include a processing bath 110, a metal plate 120, an electric power supplying part 130, a processing source solution supplying part 140, an additive agent supplying part 150, analyzers 160, a standard solution supplying part 190, and a control unit 200.

Figure 5:
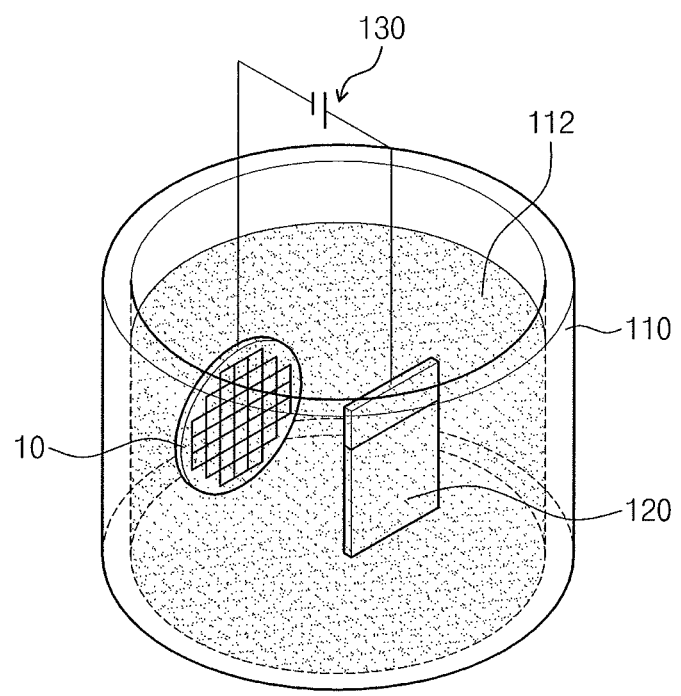
FIG. 5 illustrates a perspective view of the plating bath of FIG. 4.

FIG. 5 illustrates a perspective view of the plating bath 110 of FIG. 4. Referring to FIGS. 4 and 5, the processing bath 110 may be formed to contain processing solution 112. In example embodiments, the processing bath 110 may be configured to perform a plating process using the processing solution 112. For example, in the plating process, the substrate 10 may be dipped into the processing solution 112, which is contained in the processing bath 110. In example embodiments, the processing bath 110 may serve as a substrate processing unit, in which the plating process may be performed to form a metal layer (not shown) on the substrate 10. The metal layer may be a copper layer that is formed using an electroplating technology.

The processing solution 112 may prepared to contain mixture of a processing source solution 148 and additive agents 158. The processing source solution 148 (or a first source) may be a solution containing a source material for the plating process. For example, a metallic material to be plated on the substrate 10 may be contained in the processing source solution 148. In example embodiments, the processing source solution 148 may contain copper sulfate. The additive agents 158 (or a second source) may be prepared to adjust characteristics of a process or reaction performed using the processing source solution 148. For example, the additive agents 158 may be used to improve physical properties (e.g., lustering, leveling, crystal grain, and thickness uniformity) of the copper layer to be formed by the electroplating technology. The additive agents 158 may include an organic material. In example embodiments, the additive agents 158 may include first to third additive agents 158a, 158b, and 158c. For example, the first additive agent 158a may include a brightener. As an example, the brightener for the first additive agent 158a may include bis-(3-sulfopropyl)-disulfide (SPS). The second additive agent 158b may include a leveler. As an example, the leveler for the second additive agent 158b may include Janus Green B (JGB). The third additive agent 158c may include a surfactant. The surfactant for the third additive agent 158c may include a compound containing at least one of chlorinated material, polyoxyethylene, or polyoxypropylene. In embodiments, the additive agents 158 may further include at least one of an inhibitor or an accelerator.

The metal plate 120 may be provided in the processing solution 112 of the processing bath 110. The substrate 10 and the metal plate 120 may be disposed side-by-side in the processing bath 110. The metal plate 120 may be dissolved by the processing solution 112, and a metallic material may be continuously supplied into the processing solution 112 from the metal plate 120. The metal plate 120 may serve as a source of a metallic element to be plated on the substrate 10. The metal plate 120 may be provided in the form of a copper plate.

The electric power supplying part 130 applies a DC voltage between the substrate 10 and the metal plate 120. The applying of the DC voltage may be used to accelerate a chemical reaction between the metal plate 120 and the processing solution 112. In example embodiments, the substrate 10 may be negatively charged, and the metal plate 120 may be positively charged. An electric current may flow through the processing solution 112, and a metal layer may be plated on the substrate 10. An amount of the metal layer to be plated may increase proportional to the electric current flowing through the processing solution 112. An amount of the metal plate 120 dissolved by the processing solution 112 may increase proportional to the electric current. The control unit 200 may be configured to control the electric current generated in the electric power supplying part 130.

The processing source solution supplying part 140 supplies the processing source solution 148 to the processing bath 110 and the standard solution supplying part 190. In example embodiments, the processing source solution supplying part 140 may include at least one processing source solution tank 142, at least one processing source solution supplying line 144, and at least one processing source solution mass flow controller (MFC) 146. The processing source solution tank 142 may contain the processing source solution 148. The processing source solution tank 142 may be formed of plastic or ceramics. The processing source solution supplying line 144 may connect the processing source solution tank 142 to the processing bath 110. The processing source solution MFC 146 may be installed on the processing source solution supplying line 144 to control a flow rate of the processing source solution 148 to be supplied to the processing bath 110. The control unit 200 may be configured to control an open/closing operation of the processing source solution MFC 146.

The additive agent supplying part 150 supplies the additive agents 158 to the processing bath 110 and the standard solution supplying part 190. In example embodiments, the additive agent supplying part 150 may include first, second, and third additive agent supplying part 152, 154, and 156. The first to third additive agents 158a, 158b, and 158c may be supplied into the processing bath 110 through the additive agent supplying part 150.

The first additive agent supplying part 152 may be used to supply the first additive agent 158a into the processing bath 110. The first additive agent supplying part 152 may include a first additive agent tank 152a, a first additive agent supplying line 152b, and a first additive agent MFC 152c. The first additive agent tank 152a may contain the first additive agent 158a. The first additive agent supplying line 152b may connect the first additive agent tank 152a to the processing bath 110. The first additive agent MFC 152c may be installed on the first additive agent supplying line 152b. The first additive agent MFC 152c may be configured to control a flow rate of the first additive agent 158a to be supplied into the processing bath 110.

The second additive agent supplying part 154 may be used to supply the second additive agent 158b into the processing bath 110. The second additive agent supplying part 154 may include a second additive agent tank 154a, a second additive agent supplying line 154b, and a second additive agent MFC 154c. The second additive agent tank 154a may contain the second additive agent 158b. The second additive agent supplying line 154b may connect the second additive agent tank 154a to the processing bath 110. The second additive agent MFC 154c may be installed on the second additive agent supplying line 154b. The second additive agent MFC 154c may be configured to control a flow rate of the second additive agent 158b to be supplied into the processing bath 110.

The third additive agent supplying part 156 may be used to supply the third additive agent 158c into the processing bath 110. The third additive agent supplying part 156 may include a third additive agent tank 156a, a third additive agent supplying line 156b, and a third additive agent MFC 156c. The third additive agent tank 156a may contain the third additive agent 158c. Third additive agent supplying line 156b may connect the third additive agent tank 156a to the processing bath 110. The third additive agent MFC 156c may be installed on the third additive agent supplying line 156b. Third additive agent MFC 156c may be configured to control a flow rate of the third additive agent 158c to be supplied into the processing bath 110. The control unit 200 may be configured to control open/closing operations of the first to third additive agent MFCs 156a, 156b, and 156c.

To achieve a desired result, it may be necessary to perform the electroplating process using the processing solution 112, in which the first to third additive agents 158a, 158b, and 158c with optimized concentrations are contained. However, there may be a difference in consumption ratio between the processing source solution 148 and the first to third additive agents 158a, 158b, and 158c in the processing solution 112. For example, the processing source solution 148 of the processing bath 110 may be evaporated into the air before, during, or after the electroplating process. By contrast, some of the first to third additive agents 158a, 158b, and 158c may participate in the chemical reaction between the processing source solution 148 and the metal plate 120, and the others may be consumed by a reaction with the processing source solution 148. The consumption rate of the first to third additive agents 158a, 158b, and 158c may be higher than that of the processing source solution 148. For example, the concentrations of the additive agents 158 may be changed as an elapsed time after the electroplating process continues to increase, and it may be necessary to add the additive agents 158 into the processing solution 112 at an appropriate time. Such an addition of the additive agents 158 may be performed using the additive agent supplying part 150.

To measure the concentrations of the additive agents 158, the processing solution 112 may be supplied from the processing bath 110 to the analyzers 160 through a processing solution collecting line 162. The processing solution collecting line 162 may connect the processing bath 110 to the analyzers 160.

The analyzers 160 measure a mixing ratio between the processing source solution 148 and the additive agents 158 in the processing bath 110. In example embodiments, the analyzers 160 may measure concentrations of the additive agents 158 contained in the processing solution 112. The concentrations of the additive agents 158 may be optically and/or electrically measured in the analyzers 160. The the analyzers 160 may include an optical analyzer 170 and an electrical analyzer 180. The optical analyzer 170 may be configured to include, for example, a High Performance Liquid Chromatography (HPLC) analyzer. The electrical analyzer 180 may be configured to include, for example, a cyclic voltammetric stripping (CVS) analyzer.

Figure 6:
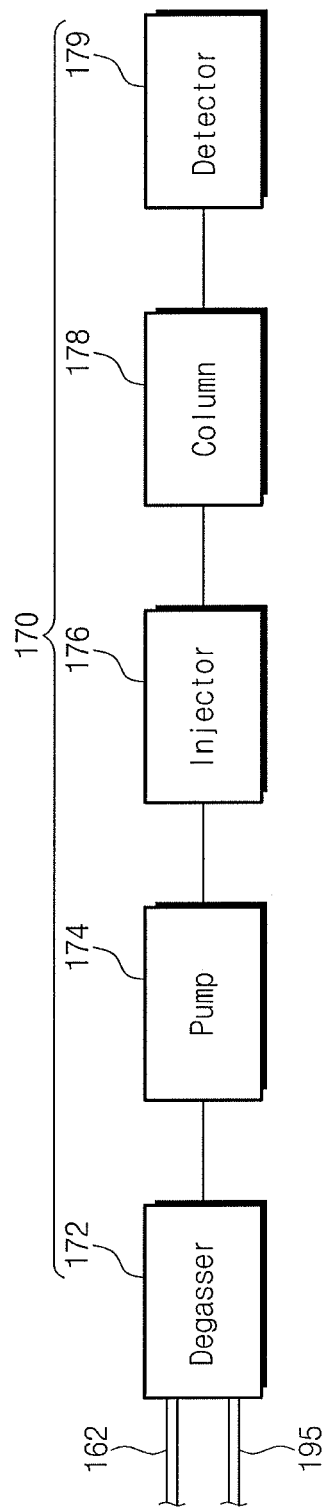
FIG. 6 illustrates a diagram of an example of the optical analyzer of FIG. 4.

FIG. 6 illustrates a diagram of an example of the optical analyzer 170 of FIG. 4. The optical analyzer 170 may include a degasser 172, a pump 174, an injector 176, a column 178, and a detector 179.

The degasser 172 removes an air bubble (e.g., of dissolved oxygen or nitrogen) from the processing solution 112 and a standard solution 197. In example embodiments, the degasser 172 may be connected to the processing solution collecting line 162 and a standard solution dispensing line 195. The processing solution collecting line 162 may connect the degasser 172 to the processing bath 110. The processing solution 112 may be supplied into the degasser 172 through the processing solution collecting line 162. The standard solution dispensing line 195 may be configured to supply the standard solution 197 to the degasser 172. The degasser 172 may be an on-line degasser. The degasser 172 may include a membrane filter (not shown), which is configured to remove air or gas from the processing solution 112 and standard solution 197.

The pump 174 may be connected to the degasser 172. The pump 174 may produce a pressure for a delivery process of the processing solution 112 or the standard solution 197. The pump 174 may be configured to have corrosion resistance with respect to the processing solution 112 or the standard solution 197.

The injector 176 may be connected to the pump 174 to supply the processing solution 112 or the standard solution 197 to the column 178.

The column 178 may be connected to the injector 176 in series. The degasser 172 and the column 178 may be connected to each other in an in-line manner. The column 178 may include a pipe-shaped container and a filler provided in the container. The column 178 or a part thereof may have a diameter of several micrometers. The processing and standard solutions 112 and 197 to be provided in the column 178 may be separated into the processing source solution 148 and the additive agents 158, after a specific elapsed time. A starting time of the separation of the processing source solution 148 and the additive agents 158 may be changed depending on the concentrations of the additive agents 158 in the processing solution 112. Further, an intensity of light to be propagated through or transmitted from the column 178 may be changed depending on the concentrations of the additive agents 158.

The detector 179 measures an intensity of light. In embodiments, the detector 179 may be configured to take images of the processing source solution 148 and the additive agents 158 provided in the column 178. The detector 179 may be configured to detect light propagated through or transmitted from the processing source solution 148 and the additive agents 158. In example embodiments, the detector 179 may include a sensor configured to sense ultraviolet or visible light.

Figure 7:
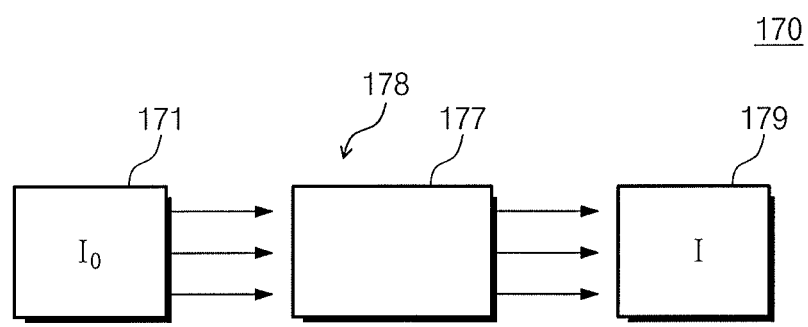
FIG. 7 illustrates a schematic diagram of an operation principle of the detector of FIG. 6.

FIG. 7 illustrates a schematic diagram of an operation principle of the detector 179 of FIG. 6. The detector 179 may be configured to detect light transmitted from a detection cell 177 of the column 178. A light source 171 may be configured to provide ultraviolet or visible light to the detection cell 177. For example, the light source 171 may include a lamp emitting ultraviolet or visible light. An absorbance A of the light measured by the detection cell 177 may be proportional to a molar absorptivity $\epsilon$, a length of light propagation path b, and a sample concentration c; for example, $A=\epsilon bc$. The molar absorptivity $\epsilon$ may be given by subtracting transmittance t from a unit value 1, which means the total probability, and in the light source 171, the transmittance t may be defined by a ratio of an intensity I of a transmitted light to an intensity $I_0$ of an incident light; i.e., $t=I/I_0$. The molar absorptivity $\epsilon$ may be given by $(1-I/I_0)$. For example, if the absorbance A, the molar absorptivity $\epsilon$, and the length of light propagation path b are determined, it may be possible to obtain the concentration c of the processing solution 112 or the standard solution 197.

In an embodiment, the concentrations of the additive agents 158 in the processing solution 112 may be calculated by comparing retention times of the processing solution 112 and the standard solution 197. The retention time is a finishing time of the separation between the processing source solution 148 and the additive agents 158 in the processing and standard solutions 112 and 197. In example embodiments, the concentrations of the additive agents 158 in the processing solution 112 may be detected on the basis of a retention time when the processing source solution 148 and the additive agents 158 of the standard solution 197 are separated from each other. If the retention time of the processing solution 112 is longer than that of the standard solution 197, the concentrations of the additive agents 158 in the processing solution 112 may be smaller than those of the additive agents 158 in the standard solution 197. If there is no difference in retention time between the standard and processing solutions 197 and 112, the standard and processing solutions 197 and 112 may be understood to contain the additive agents 158 at the same concentration.

Figure 8A:
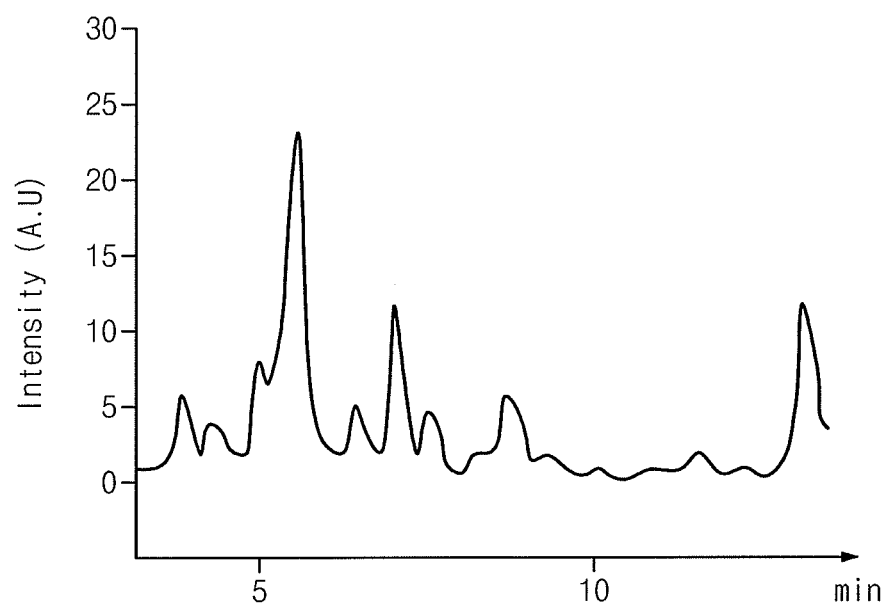
FIGS. 8A and 8B are graphs obtained from HPLC measurements of standard and plating solutions.
Figure 8B:
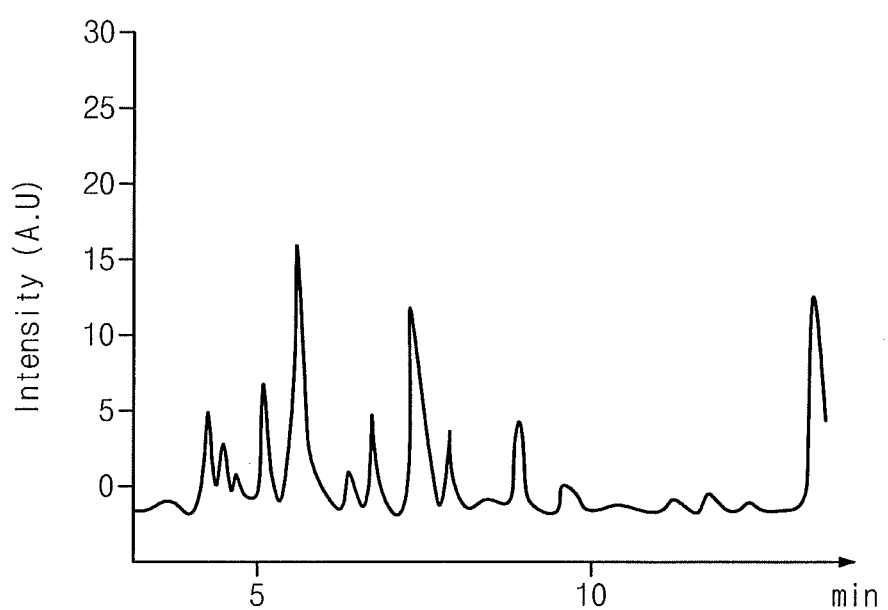

FIGS. 8A and 8B illustrate graphs obtained from HPLC measurements performed on the standard and plating solutions 197 and 112. In FIGS. 8A and 8B, two peaks at a range of 5-6 minutes represent the presence of first and second additive agents 158a and 158b, respectively, a peak at a position of about 7 minute represents the presence of the third additive agent 158c. For the standard and processing solutions 197 and 112, the peaks associated with the first additive agent 158a were measured at the same position. Similarly, for the standard and processing solutions 197 and 112, the peaks associated with third additive agent 158c were measured at the same position. These results shows that the standard and processing solutions 197 and 112 contained the first additive agents 158a of the same concentration and the third additive agents 158c of the same concentration.

By contrast, the peak associated with the second additive agent 158b was earlier in time in the standard solution 197 than the processing solution 112. This shows that the concentration of the second additive agent 158b was lower in the processing solution 112 than in the standard solution 197. The second additive agent 158b may be additionally supplied to the processing bath 110 from the second additive agent supplying part 154 by the reduced amount of the second additive agent 158b. The second additive agent MFC 154c may be configured to control a flow rate of the second additive agent 158b.

Figure 9:
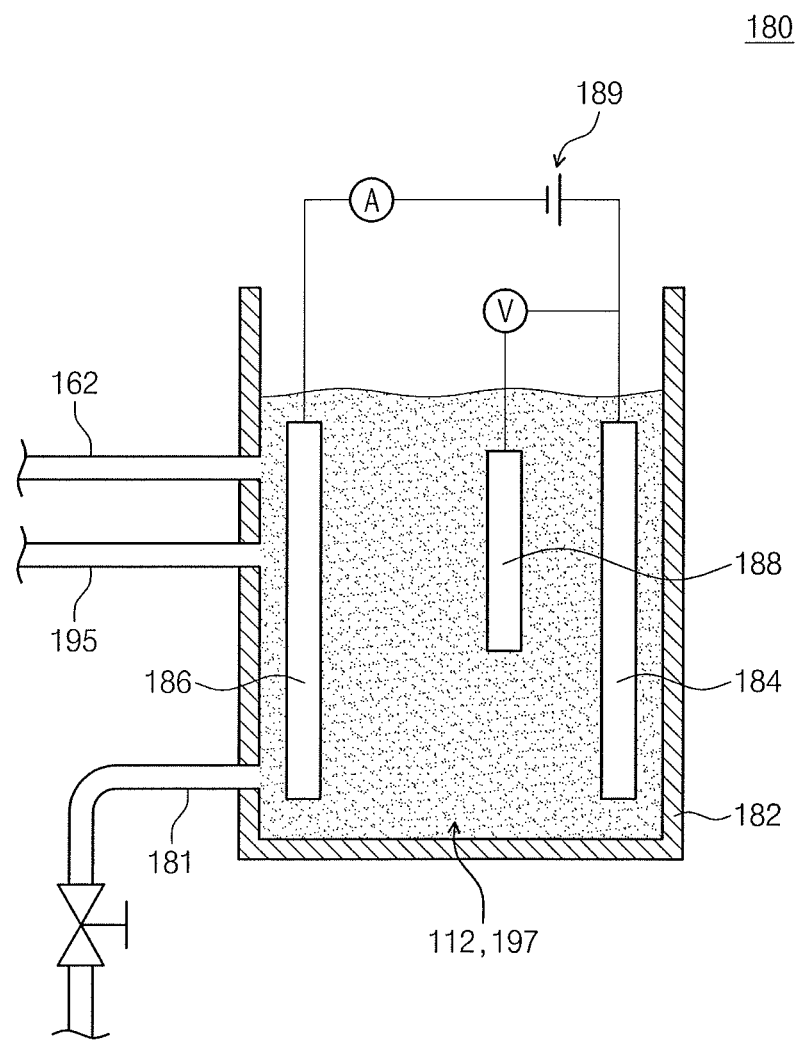
FIG. 9 illustrates a diagram of an example of the electrical analyzer of FIG. 4.

FIG. 9 illustrates a diagram of an example of the electrical analyzer 180 of FIG. 4. The electrical analyzer 180 may include a chemical solution bath 182, a working electrode 184, a counter electrode 186, and a reference electrode 188.

The chemical solution bath 182 may contain the processing solution 112 and the standard solution 197. The chemical solution bath 182 may be connected to the processing solution collecting line 162 and the standard solution dispensing line 195. The processing solution 112 and the standard solution 197 may be supplied into the chemical solution bath 182 through the processing solution collecting line 162 and the standard solution dispensing line 195, respectively. The chemical solution bath 182 may be connected to an exhaust port 181. The processing solution 112 and the standard solution 197 may be discharged from chemical solution bath 182 through the exhaust port 181. The exhaust port 181 may be disposed below the processing solution collecting line 162 and the standard solution dispensing line 195. The working electrode 184 may be provided in the chemical solution bath 182. The counter electrode 186 may be provided in the chemical solution bath 182 to face the working electrode 184. The reference electrode 188 may be provided between the working electrode 184 and the counter electrode 186.

In the case where voltages applied to the reference electrode 188 and the working electrode 184 are repeatedly switched, a metal layer may be repeatedly plated on or removed from a surface of the working electrode 184. By measuring an electric current flowing between the working electrode 184 and the counter electrode 186, it may be possible to calculate the concentrations of the additive agents 158. The electrical analyzer 180 may not be able to directly measure the concentrations of the additive agents 158. In the electrical analyzer 180, the concentrations of the additive agents 158 in the processing solution 112 may be obtained as relative values to the concentrations of the additive agents 158 of the standard solution 197.

Figure 10:
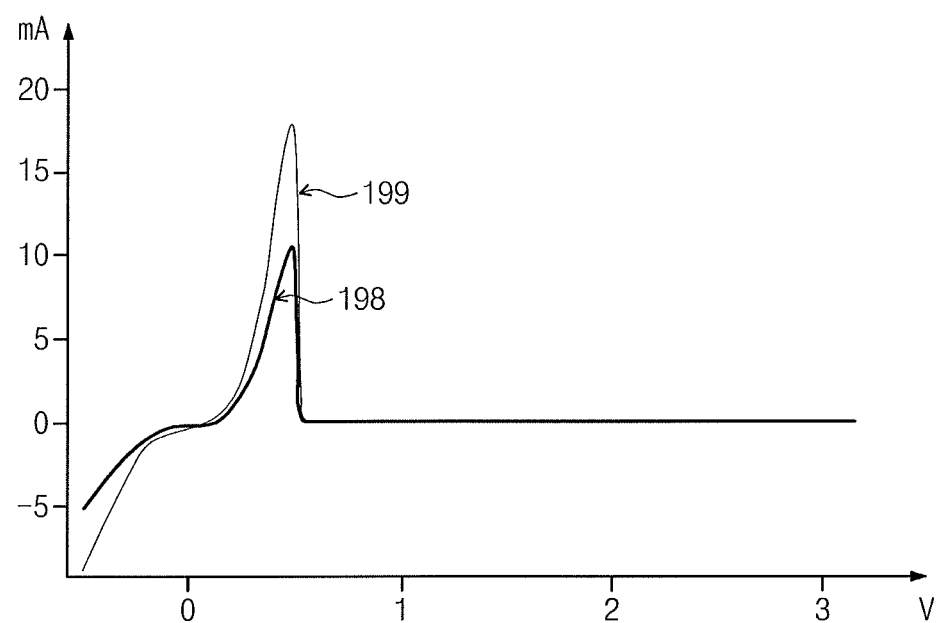
FIG. 10 illustrates a graph of concentrations of first additive agents that were contained in the standard and plating solutions, respectively, and were measured by the electrical analyzer of FIG. 9.

FIG. 10 illustrates a graph of concentrations of first additive agents 158a that were contained in the standard and plating solutions 197 and 112, respectively, and were measured by the electrical analyzer 180 of FIG. 9. A first peak 199 of the standard solution 197 may be higher than a second peak 198 of the processing solution 112, and a concentration of the first additive agent 158a in the processing solution 112 may be lower than a concentration of the first additive agent 158a in the standard solution 197. The first additive agent supplying part 152 may supply the first additive agent 158a into the processing bath 110, and a difference between the concentrations of the first additive agents 158a contained in the processing and standard solutions 112 and 197, respectively, may be reduced. Although not shown, the concentrations of the first additive agents 158a in the processing and standard solutions 112 and 197 may be the same, and the second peak 198 of the processing solution 112 may become the same as the first peak 199 of the standard solution 197.

Referring back to FIG. 4, the standard solution supplying part 190 may supply the standard solution 197 into the analyzers 160. In example embodiments, the standard solution supplying part 190 may include standard solution supplying lines 192, standard MFCs 194, and a standard solution bath 196.

The standard solution supplying lines 192 deliver the processing source solution 148 and the additive agents 158 into the standard solution bath 196. The standard solution supplying lines 192 may connect the processing source solution tank 142 of the processing source solution supplying part 140 to the analyzers 160. The standard solution supplying lines 192 may connect the first to third additive agent tanks 152a, 154a, and 156a of the additive agent supplying part 150 to the analyzers 160. In example embodiments, the standard solution supplying lines 192 may include standard source lines 191, a standard source mixing line 193, and the standard solution dispensing lines 195. The standard source lines 191 may include a standard processing source solution supplying line 191a and first to third standard additive agent supplying lines 191b, 191c, and 191d. The standard processing source solution supplying line 191a may connect the processing source solution tank 142 to the standard source mixing line 193. The first to third standard additive agent supplying lines 191b, 191c, and 191d may connect the first to third additive agent tanks 152a, 154a, and 156a to the standard source mixing line 193. The processing source solution 148 and the additive agents 158 may be mixed in the standard source mixing line 193. The standard source mixing line 193 may connect the standard processing source solution supplying line 191a and the first to third standard additive agent supplying lines 191b, 191c, and 191d to the standard solution bath 196. The standard solution dispensing lines 195 may connect the standard solution bath 196 to the analyzers 160. In embodiments, the standard solution dispensing lines 195 may be branched off into two lines connected to the optical analyzer 170 and the electrical analyzer 180, respectively.

The standard MFCs 194 may be installed on the standard processing source solution supplying line 191a and the first to third standard additive agent supplying lines 191b, 191c, and 191d, respectively. The standard MFCs 194 may be configured to control flow rates of the processing source solution 148 and the additive agents 158. For example, the standard MFCs 194 may include a standard processing source solution MFC 194a and first to third standard additive agent MFCs 194b, 194c, and 194d. The standard processing source solution MFC 194a may be installed on the standard processing source solution supplying line 191a. The standard processing source solution MFC 194a may be configured to control a flow rate of the processing source solution 148. The first to third standard additive agent MFCs 194b, 194c, and 194d may be installed on the standard additive agent supplying lines 191b, 191c, and 191d, respectively. The first to third standard additive agent MFCs 194b, 194c, and 194d may be configured to control flow rates of the additive agents 158.

The control unit 200 controls open/closing operations of the standard processing source solution MFC 194a and the first to third standard additive agent MFCs 194b, 194c, and 194d. The standard processing source solution MFC 194a may be configured to be interworked, e.g., may be supplied alternatively or simultaneously, with the first to third standard additive agent MFCs 194b, 194c, and 194d. Each of the standard processing source solution MFC 194a and the first to third standard additive agent MFCs 194b, 194c, and 194d may be configured to control a flow rate of a corresponding one the processing source solution 148 and the additive agents 158 in such a way that the standard solution 197 has a desired mixing ratio.

The standard solution bath 196 may be disposed between the standard source mixing line 193 and the standard solution dispensing lines 195. The standard solution bath 196 may be configured to contain the standard solution 197. The standard solution 197 may be uniformly mixed in the standard solution bath 196.

For the comparative electroplating apparatus, a standard solution manually prepared by a vendor may be used to adjust a measurement reference value of the analyzers 160. The manually-prepared standard solution may suffer from low reliability. Exact concentrations of the additive agents 158 in the standard solution 197 may be difficult to obtain. Moreover, the standard solution 197 may be contaminated during storage and delivery.

The standard solution supplying part 190 makes it possible to improve reliability in an adjusting operation of the analyzers 160. The standard solution supplying part 190 may reduce or minimize a process time required for the storing and delivery of the standard solution. The standard solution supplying part 190 may supply the standard solution into the analyzers 160 in real time. For example, the adjusting operation of the analyzers 160 may be performed using the highly-reliable standard solution 197 supplied from the standard solution supplying part 190.

The control unit 200 controls the processing bath 110, the electric power supplying part 130, the processing source solution supplying part 140, the additive agent supplying part 150, the analyzers 160, and the standard solution supplying part 190. The control unit 200 may also be configured to monitor a substrate processing operation performed in the processing bath 110. The control unit 200 may control the analyzers 160 to automatically adjust a measurement reference value using the standard solution 197. Further, the control unit 200 may monitor the concentration of the processing solution 112 using the analyzers 160 and control the additive agent supplying part 150 for automatically adding the additive agents 158 into the processing bath 110.

The substrate processing apparatus 111 according to example embodiments may be used to process a substrate, as will be described in more detail below.

Figure 11:
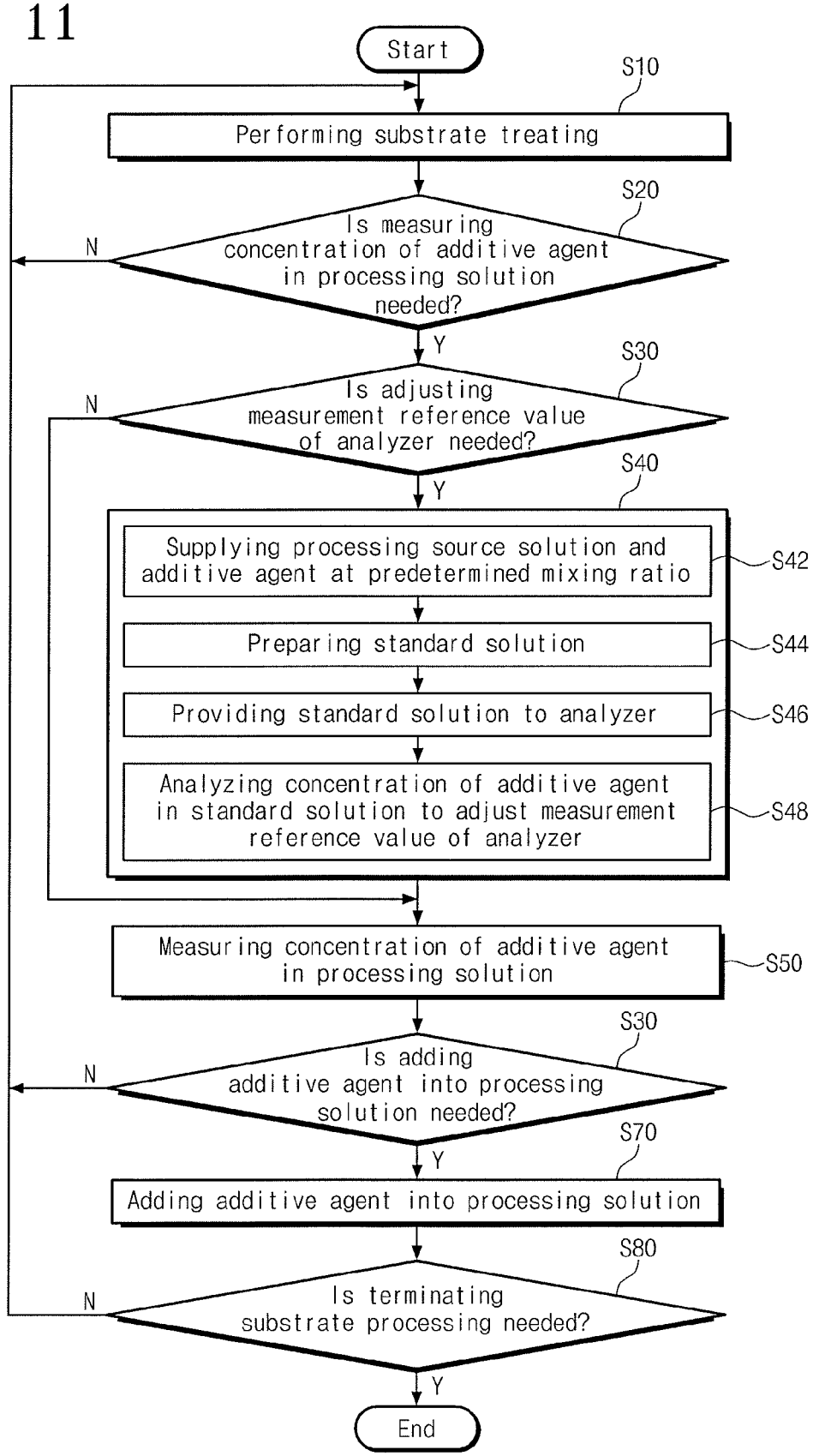
FIG. 11 illustrates a flow chart of a method of processing a substrate according to example embodiments.

FIG. 11 illustrates a flow chart of a method of processing a substrate according to example embodiments.

A substrate treating operation is performed (in S10). In example embodiments, the substrate treating operation S10 may be a process of plating the substrate 10. In the substrate treating operation S10, a process time required on each substrate 10 may be from about several minutes to several ten minutes. The substrate 10 may be plated in the processing solution 112. The concentrations of the additive agents 158 in the processing solution 112 may be changed depending on an elapsed time of the plating process.

Next, the control unit 200 may determine whether to measure the concentrations of the additive agents 158 (in S20). The measurement of the concentrations of the additive agents 158 may be periodically performed. For example, the measurement of the concentrations of the additive agents 158 may be periodically performed every about 24 to 48 hours after the plating process. The period of the measurement may be different from each other between the additive agents 158. For example, there may be a difference in concentration measurement period between the first, second, and third additive agent 158a, 158b, and 158c.

Thereafter, the control unit 200 may determine whether or not to adjust a measurement reference value of the analyzers 160, which will be used to measure the concentrations of the additive agents 158 (in S30). The measurement reference value of the analyzers 160 may be periodically adjusted. For example, the measurement reference value may be adjusted every about one week to about one month. In an embodiment, the measurement reference value of the analyzers 160 may be adjusted when a failure event occurs in the plating operation S10. There may be no need to amend the measurement reference value of the analyzers 160, and the analyzers 160 may perform a process of measuring the concentrations of the additive agents 158 in the processing solution 112 (in S50).

Adjusting of the measurement reference value may be needed, and the measurement reference value of the analyzers 160 may be adjusted (in S40). In example embodiments, the operation S40 of adjusting the measurement reference value may include operations of supplying the processing source solution 148 and the additive agents 158 (in S42), preparing the standard solution 197 (in S44), providing the standard solution 197 to the analyzers 160 (in S46), and measuring the concentrations of the additive agents 158 in the standard solution 197 (in S48).

In the operation S42, the processing source solution 148 and the additive agents 158 may be supplied into the standard solution supplying part 190 at predetermined flow rates. The flow rate of each of the processing source solution 148 and the additive agents 158 may be controlled by the standard MFCs 194.

In the operation S44, the processing source solution 148 and the additive agents 158 may be mixed with each other to prepare the standard solution 197. The processing source solution 148 and the additive agents 158 may be mixed in the standard source mixing line 193. The processing source solution 148 and the additive agents 158 may be uniformly re-mixed in the standard solution bath 196.

In the operation S36, the standard solution 197 may be supplied into the analyzers 160 through the standard solution dispensing line 195. For example, the standard solution 197 may be supplied into the degasser 172 and the chemical solution bath 182 of the analyzers 160.

In the operation S48, the concentrations of the additive agents 158 contained in the standard solution 197 may be measured by optical and electrical methods. The analyzers 160 may measure the concentrations of the additive agents 158 in the standard solution 197. The concentrations of the additive agents 158 in the standard solution 197 may be used as the measurement reference value of the analyzers 160, when the concentrations of the additive agents 158 in the processing solution 112 are measured. An initially-set measurement reference value of the analyzers 160 may be changed by a new measurement reference value, and adjusting of the measurement reference value of the analyzers 160 may be finished. The standard solution 197 may be removed from the analyzers 160.

Next, the analyzers 160 may measure the concentrations of the additive agents 158 in the processing solution 112 (in S50). The processing solution 112 may be supplied into the analyzers 160 through the processing solution collecting line 162. The analyzers 160 may perform a relative analysis on the concentrations of the additive agents 158 in the processing solution 112, based on the measurement reference value of the standard solution 197.

Afterwards, the control unit 200 may determine whether to add the additive agents 158 into the processing bath 110, on the basis of the measurement results on the concentrations of the additive agents 158 (in S60). There may be no significant difference between the concentrations of the additive agents 158 in the processing and standard solutions 112 and 197, and the substrate treating operation S10 may be performed without the operation S60 of adding the additive agents 158.

The additive agents 158 in the processing solution 112 may have a significantly lower concentration than those in the standard solution 197, and the additive agents 158 may be added into the processing solution 112 (in S70). The additive agents 158 may be added into the processing solution 112, and a difference between the concentrations of the additive agents 158 contained in the processing and standard solutions 112 and 197 may be reduced.

Next, the substrate treating operation S10 may be terminated or repeated, depending on whether or not to terminate the substrate treating operation S10 (in S80).

[Substrate Processing Apparatus: Other Example Embodiments]

Figure 12:
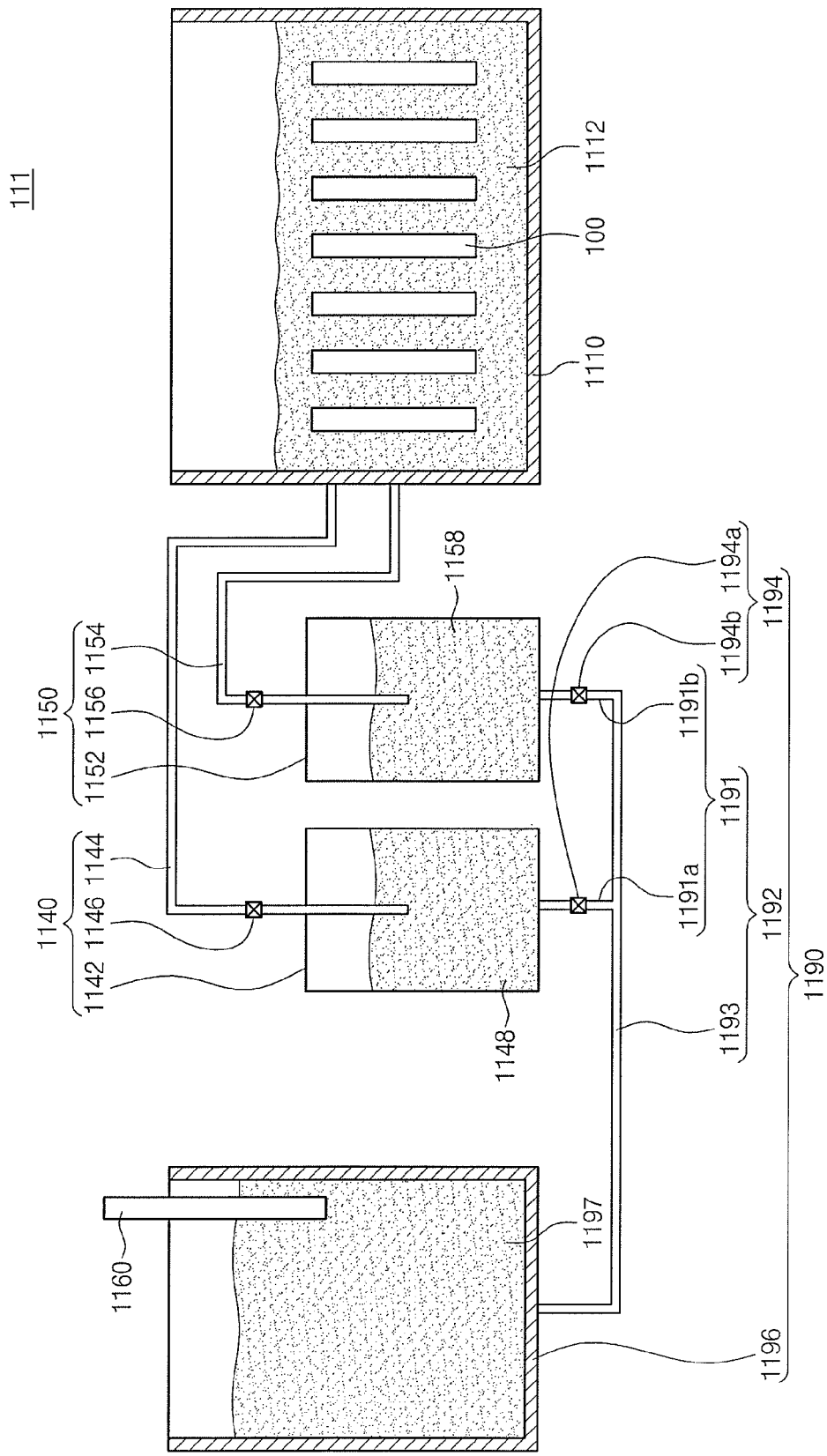
FIG. 12 illustrates a diagram of an apparatus for processing a substrate according to other example embodiments.

FIG. 12 illustrates a diagram of an apparatus 1111 for processing a substrate according to other example embodiments. The substrate processing apparatus 1111 may include a processing bath 1110, a processing source solution supplying part 1140, a deionized water supplying part 1150, an analyzer 1160, and a standard solution supplying part 1190.

The processing bath 1110 processes the substrate 100 therein. The processing bath 1110 may be configured to contain a processing solution 1112. In example embodiments, the processing bath 1110 may be configured to perform an etching process therein, and the processing solution 1112 may be an etching solution. In the etching process, the substrate 100 may be dipped in the processing solution 1112 contained in the processing bath 1110. The processing solution 1112 may contain a material capable of etching the substrate 100 or a thin film (not shown) on the substrate 100. For example, the processing solution 1112 may contain a processing source solution 1148 and deionized water 1158. The processing source solution 1148 may be an etching source solution. For example, the processing source solution 1148 may be prepared to contain at least one of sulfuric acid, hydrochloric acid, hydrofluoric acid, or nitric acid.

The processing source solution supplying part 1140 supplies the processing source solution 1148 into the processing bath 1110. In example embodiments, the processing source solution supplying part 1140 may include a processing source solution tank 1142, a processing source solution supplying line 1144, and a processing source solution MFC 1146. The processing source solution tank 1142 may be configured to contain the processing source solution 1148. The processing source solution supplying line 1144 may connect the processing source solution tank 1142 to the processing bath 1110. The processing source solution MFC 1146 may be installed on the processing source solution supplying line 1144 to control a flow rate of the processing source solution 1148.

The deionized water supplying part 1150 supplies the deionized water into the processing bath 1110. In example embodiments, the deionized water supplying part 1150 may include a deionized water tank 1152, a deionized water supplying line 1154, and a deionized water MFC 1156.

The processing solution 1112 may be heated during the process of etching the substrate 10. For example, the processing solution 1112 may be heated up to a temperature above the room temperature, and this heating may lead to evaporation of the deionized water. The evaporation of the deionized water may lead to an increase in acidity of the processing solution 1112; for example, a hydrogen ion concentration (or pH) of the processing solution 1112 may be lowered. The deionized water 1158 may be added into the processing solution 1112 to help realize a desired pH value of the processing solution 1112. A pH value of the processing solution 1112 in the processing bath 1110 may be measured by the analyzer 1160.

The analyzer 1160 measures pH values of the processing solution 1112 and the standard solution 1197. In example embodiments, the analyzer 1160 may include a pH meter. For example, the analyzer 1160 may be configured to detect hydrogen ions, which are contained in the processing solution 1112 or the standard solution 1197, and calculate a pH value based on the detection. The analyzer 1160 may be a glass electrode configured to measure a potential difference, which is proportional to hydrogen ion concentrations of the processing solution 1112 and the standard solution 1197.

In the analyzer 1160, a reference value for the pH measurement may be adjusted before measuring the pH value of the processing solution 1112. The analyzer 1160 may be set to display a predetermined pH value for the standard solution 1197. For example, the pH value of the standard solution 1197 may be 4. If the standard solution 1197 has a measured pH value (e.g., of 3.8) different from the predetermined value, the analyzer 1160 may be adjusted in such a way that the standard solution 1197 has the predetermined pH value (e.g., of 4.0).

The standard solution supplying part 1190 may supply the standard solution 1197 into the analyzer 1160. In example embodiments, the standard solution supplying part 1190 may include standard solution supplying lines 1192, standard MFCs 1194, and a standard solution bath 1196.

The standard solution 1197 containing the processing source solution 1148 and the deionized water 1158 may be supplied into the standard solution bath 1196 through the standard solution supplying lines 1192. In example embodiments, the standard solution supplying lines 1192 may include standard source lines 1191 and a standard source mixing line 1193. The standard source lines 1191 may be used to supply the processing source solution 1148 and the deionized water 1158 into the standard source mixing line 1193. The processing source solution 1148 and the deionized water 1158 may be mixed with each other in the standard source mixing line 1193 and then be supplied into the standard solution bath 1196. The standard source lines 1191 may include a standard processing source solution supplying line 1191a and a standard deionized water supplying line 1191b. The standard processing source solution supplying line 1191a may connect the processing source solution tank 1142 to the standard source mixing line 1193. The standard deionized water supplying line 1191b may connect the deionized water tank 1152 to standard source mixing line 1193. The standard source mixing line may connect the standard source lines 1191 to the standard solution bath 1196.

The standard MFCs 1194 may be installed on the standard source lines 1191, respectively. The standard MFCs 1194 may be configured to control the flow rates of the processing source solution 1148 and the deionized water 1158. For example, the standard MFCs 1194 may include a standard processing source solution MFC 1194a and a standard deionized water MFC 1194b. The standard processing source solution MFC 1194a may be installed on the standard processing source solution supplying line 1191a. The standard processing source solution MFC 1194a may be configured to control the flow rate of the processing source solution 1148. The standard deionized water MFC 1194b may be installed on the standard deionized water supplying line 1191b. The standard deionized water MFC 1194b may be configured to control the flow rate of the deionized water 1158.

The standard processing source solution MFC 1194a may be configured to be interworked, e.g., supplied alternatively or simultaneously, with the standard deionized water MFC 1194b. The standard processing source solution MFC 1194a and the standard deionized water MFC 1194b may be configured to control a flow rate of each of the processing source solution 1148 and the deionized water 1158 in such a way that the standard solution 1197 has a desired mixing ratio.

The standard solution bath 1196 contains the standard solution 1197. In the analyzer 1160, the standard solution 1197 in the standard solution bath 1196 may be used to adjust a reference value for the pH measurement.

Although not shown, the substrate processing apparatus 11110 may further include a control unit. The control unit may be configured to control the processing bath 1110, the processing source solution supplying part 1140, the deionized water supplying part 1150, the analyzer 1160, and the standard solution supplying part 1190.

The substrate processing apparatus 1111 according to other example embodiments may be used to process a substrate, as will be described in more detail below.

Figure 13:
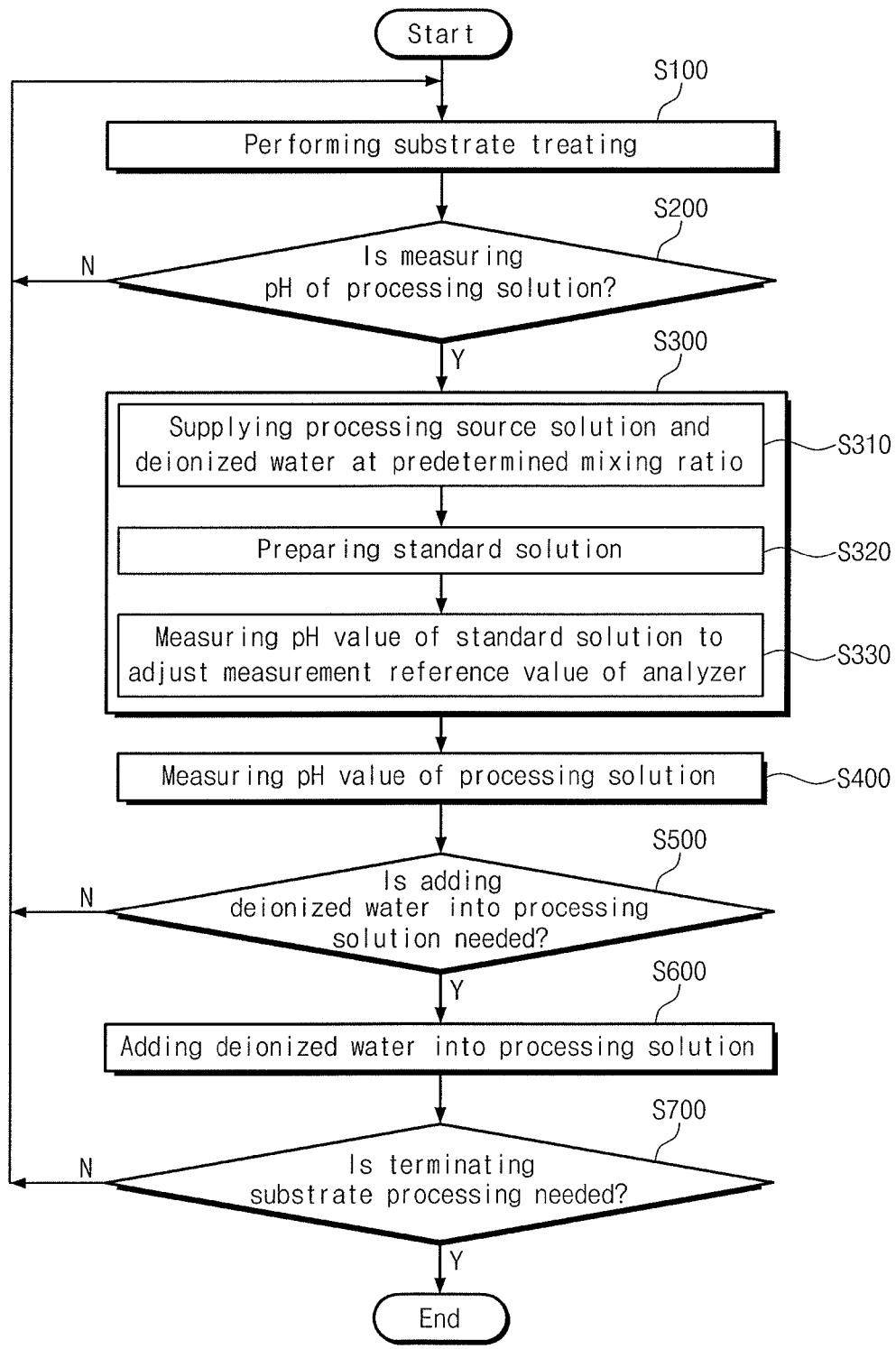
FIG. 13 illustrates a flow chart of a method of processing a substrate according to other example embodiments.

FIG. 13 illustrates a flow chart of a method of processing a substrate according to other example embodiments.

A substrate treating operation is performed (in S100). In example embodiments, the substrate treating operation S100 may be a process of etching the substrate 100. In the substrate treating operation S100, each of the substrates 100 may be processed during a process time ranging from about several minutes to several ten minutes in the processing bath 1110. The pH of the processing solution 1112 may be changed depending on an elapsed time of the etching process.

Next, the control unit may determine whether or not to measure the pH value of the processing solution 1112 (in S200). The pH value of the processing solution 1112 may be periodically measured. For example, the measurement of the concentrations of the additive agents 158 may be periodically performed every about 12 to 48 hours after the electroplating process.

Thereafter, the measurement reference value of the analyzer 1160 may be adjusted (in S300). In example embodiments, the operation S300 of adjusting the measurement reference value may include operations of supplying the processing source solution 1148 and the deionized water 1158 (in S310), preparing the standard solution 1197 (in S320), and measuring a pH value of the standard solution 1197 (in S330).

In the operation S310, the processing source solution 1148 and the deionized water 1158 may be supplied to the standard solution supplying part 1190 at predetermined flow rates from the processing source solution supplying part 1140 and the deionized water supplying part 1150, respectively. The flow rates of the processing source solution 1148 and the deionized water 1158 may be respectively controlled by the standard MFCs 1194.

In the operation S320, the processing source solution 1148 and the deionized water 1158 may be mixed with each other to prepare the standard solution 1197. The processing source solution 1148 and the deionized water 1158 may be mixed with each other in the standard source mixing line 1193. The processing source solution 1148 and the deionized water 1158 may be uniformly mixed in the standard solution bath 1196.

In the operation S330, the pH value of the standard solution 1197 may be measured, and then, a measurement value of the analyzer 1160 may be adjusted using the measurement reference value of the standard solution 1197. The analyzer 1160 may be disposed in the standard solution 1197. For example, the analyzer 1160 may be dipped in the standard solution 1197 during about 5 minutes or more. The analyzer 1160 may measure a pH value of the standard solution 1197. In embodiments, the standard solution 1197 may be adjusted by the analyzer 1160 to have a predetermined pH value.

Next, the pH value of the processing solution 1112 may be measured (in S400). For example, the adjusted analyzer 1160 may be dipped in the processing solution 1112 to measure the pH value of the processing solution 1112.

Thereafter, the measured pH value of the processing solution 1112 may be used to determine whether or not to add the deionized water 1158 in the processing bath 1110 (in S500). There may be no significant difference the measured and predetermined pH values of the processing solution 1112, and the substrate treating operation S100 may be again performed without a subsequent operation S600 of adding the deionized water 1158.

The pH value of the processing solution 1112 may be different from the predetermined pH value, and the deionized water 1158 may be added into the processing solution 1112 (in S600). The deionized water 1158 may be added into the processing bath 1110 until the pH value of the processing solution 1112 is substantially the same as the predetermined pH value.

Next, the substrate treating operation may be terminated or repeated depending on whether or not to terminate the substrate treating operation S100 (in S700).

As described above, the standard solution supplying part 190 of the substrate processing apparatus 111 may have the standard solution tank 196. In embodiments, the standard solution tank 196 may not be provided as an independent element that is distinct from the standard solution supplying lines 192. The standard solution 197 may be provided in the standard solution tank 196 through the standard solution supplying lines 192.

In afore-described exemplary embodiments, the substrate may be a semiconductor wafer. In embodiments, the substrate may be a printed circuit board. Further, in afore-described exemplary embodiments, the substrate may have chip dies. In embodiments, the chip dies may be a unit substrate, such as a memory module mounted with semiconductor chips, a graphic card, an audio card, a LAN (local area network) card, or main boards of mobile devices.

By way of summation and review, an electroplating process may be used to deposit a metal layer on a semiconductor substrate in a wet manner. To help automatically manage a plating solution used in an electroplating apparatus and realize a safe working environment, adding an additive agent in the plating solution should be stably performed, based on an analysis on a concentration of the additive agent. An analyzer may be configured to measure a concentration of the plating solution. In many analyzers, a standard solution may be used to adjust a measurement reference value, before analyzing the plating solution.

The standard solution may be provided by an external vendor, not a semiconductor manufacturer, which may lead to difficulties, including, for example, that a reference concentration of the standard solution may not be exactly known. The reference concentration of the standard solution may differ from vendor to vendor. The reference concentration may be changed depending on, for example, fabrication date of the standard solution, and delivery and storage environments. Additionally, it may be hard to achieve an automated addition of the plating solution. The standard solution may be manually supplied in the analyzer by an operator, which may lead to technical difficulties in adjusting the measurement reference value and managing the analyzer or an economical issue (e.g., an increase in cost of the standard solution).

According to example embodiments, the standard solution may be prepared in the substrate processing, e.g., electroplating, apparatus and may be used as the measure reference value of the analyzer in real time. Example embodiments provide such a substrate processing apparatus, including an analyzer whose operation may be controlled in real time, and a method of processing a substrate using the same.

According to example embodiments, a substrate processing apparatus may include a substrate processing unit, a source supplying part analyzer, and a standard solution supplying part. The substrate processing unit stores a processing solution containing at least one source and the analyzer measures a concentration of the at least one source or a pH value of the processing solution. The standard solution supplying part may supply a standard solution, which may be used to adjust a measurement reference value of the analyzer, to the analyzer. The analyzer may be adjusted before measuring the concentration of the source in the processing solution or the pH value of the processing solution (for example, in real time).

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate processing apparatus, comprising:
a substrate processing unit to process a substrate using a processing solution containing a mixture of first and second sources;
a source supplying part directly connected into the substrate processing unit to supply the first and second sources to the substrate processing unit;
at least one analyzer connected into the substrate processing unit to measure a concentration of the second source in the processing solution or a pH value of the processing solution and adjust a measurement reference value of the second source in the processing solution using a standard solution, in which the first and second sources are mixed to have a predetermined concentration or pH value; and
a standard solution supplying part connected between the source supplying part and the at least one analyzer to prepare, on demand, the standard solution using the first and second sources supplied from the source supplying part, and to supply the standard solution to the at least one analyzer when the at least one analyzer requires calibration.

2. The apparatus as claimed in claim 1, wherein the standard solution supplying part includes:
a standard solution bath containing the standard solution; and
a plurality of standard solution supplying lines connecting the standard solution bath to the source supplying part.

3. The apparatus as claimed in claim 2, wherein the standard solution supplying part further includes standard mass flow controllers on the standard solution supplying lines respectively to control flow rates of the first and second sources to be supplied to the standard solution bath.

4. The apparatus as claimed in claim 3, wherein the source supplying part includes:
a first source supplying part to supply the first source to each of the substrate processing unit and the standard solution supplying part; and
a second source supplying part to supply the second source to each of the substrate processing unit and the standard solution supplying part,
wherein the standard solution supplying lines include:
standard source supplying lines connected to the first and second source supplying parts, respectively; and
a standard source mixing line connecting the standard source supplying lines to the standard solution bath and mixing the first and second sources with each other.

5. The apparatus as claimed in claim 4, wherein the standard source supplying lines include:
a first standard source line connecting the first source supplying part to the standard source mixing line; and
a second standard source line connecting the second source supplying part to the standard source mixing line.

6. The apparatus as claimed in claim 5, wherein the standard mass flow controllers include:
a first standard mass flow controller on the first standard source line to control the flow rate of the first source; and a second standard mass flow controller on the second standard source line to control the flow rate of the second source,
wherein the first and second sources in the standard solution have a predetermined mixing ratio in the standard solution bath.

7. The apparatus as claimed in claim 5, wherein the first source supplying part includes:
a first source tank containing the first source;
a first source supplying line connecting the first source tank and the substrate processing unit; and
a first source process mass flow controller on the first source supplying line to control the flow rate of the first source,
wherein the first source tank is connected to the first standard source line.

8. The apparatus as claimed in claim 5, wherein the second source supplying part includes:
a second source tank containing the second source;
a second source line connecting the second source tank and the substrate processing unit; and
a second source process mass flow controller on the second source line to control the flow rate of the second source,
wherein the second source tank is connected to the second standard source line.

9. The apparatus as claimed in claim 2, wherein the standard solution supplying lines include standard solution dispensing lines between the standard solution bath and the at least one analyzer.

10. The apparatus as claimed in claim 9, wherein the at least one analyzer includes:
an optical analyzer optically measuring a concentration of the second source in the standard solution; and
an electrical analyzer electrically measuring the concentration of the second source in the standard solution,
wherein the standard solution dispensing lines connect the standard solution bath to the optical and electrical analyzers, respectively.

11. The apparatus as claimed in claim 10, further comprising a processing solution collecting line connecting the substrate processing unit to the optical and electrical analyzers to supply the processing solution in the substrate processing unit to the optical and electrical analyzers.

12. The apparatus as claimed in claim 11, wherein the optical analyzer includes:
a degasser to remove an air bubble from the processing solution or the standard solution;
a column extending from the degasser and through which at least one of the processing solution and the standard solution flows; and
a photodetector sensing the second source in the at least one of the processing solution and the standard solution flowing through the column,
wherein the degasser is connected to the standard solution dispensing lines and the processing solution collecting line.

13. The apparatus as claimed in claim 11, wherein the electrical analyzer includes:
a chemical solution bath containing the processing or standard solution;
electrodes dipped in the processing or standard solution of the chemical solution bath; and
an ammeter measuring an electric current flowing between the electrodes, wherein the chemical solution bath is connected to the processing solution collecting line and the standard solution dispensing lines.

14. A substrate processing apparatus, comprising:
a substrate processing unit to process a substrate using a processing solution containing a mixture of first and second sources;
a source supplying part connected into the substrate processing unit
at least one analyzer connected into the substrate processing unit to measure a concentration of the second source in the processing solution or a pH value of the processing solution and adjust a measurement reference value of the second source in the processing solution using a standard solution, in which the first and second sources are mixed to have a predetermined concentration or pH value; and
a standard solution supplying part connected between the source supplying part and the at least one analyzer to prepare, on demand, the standard solution using the first and second sources to be supplied from the source supplying part, and to supply the standard solution to the at least one analyzer when the at least one analyzer requires calibration,
wherein the source supplying part includes:
a first and second tanks; and
a first and second source lines connecting the first and second tanks into the substrate processing unit,
wherein the standard solution part includes:
a standard solution bath containing the standard solution; and
supplying lines including first and second standard solution supplying lines which are connected into the first and second tanks, and a standard solution mixing line which connects the first and second standard solution supplying lines into the standard solution bath.

* * * * *